(12) United States Patent
Levey et al.

(10) Patent No.: US 8,575,057 B2
(45) Date of Patent: Nov. 5, 2013

(54) UV CURABLE CATALYST COMPOSITIONS

(75) Inventors: Peter R. Levey, Bellmore, NY (US);
Nathaniel E. Brese, Farmingdale, NY (US); Neil D. Brown, Merrick, NY (US); Stanley J. Jasne, Yorktown, NY (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 1462 days.

(21) Appl. No.: 11/287,672

(22) Filed: Nov. 28, 2005

(65) Prior Publication Data

US 2006/0153990 A1    Jul. 13, 2006

Related U.S. Application Data

(60) Provisional application No. 60/631,103, filed on Nov. 26, 2004.

(51) Int. Cl.
*B01J 31/00*    (2006.01)

(52) U.S. Cl.
USPC .......... 502/159; 502/150; 502/332; 502/333; 502/334; 502/335

(58) Field of Classification Search
USPC .................................. 502/150, 342
See application file for complete search history.

(56) References Cited

U.S. PATENT DOCUMENTS

| | | | |
|---|---|---|---|
| 4,469,714 A | | 9/1984 | Wada et al. |
| 5,288,313 A | * | 2/1994 | Portner .................. 106/1.11 |
| 7,226,710 B2 | * | 6/2007 | Nishikubo et al. .............. 430/14 |
| 2005/0241949 A1 | | 11/2005 | Crouse |

FOREIGN PATENT DOCUMENTS

| | | |
|---|---|---|
| EP | 0 445 791 | 10/1995 |
| EP | 0 761 842 | 3/1999 |
| JP | 2-047544 | 10/1990 |

* cited by examiner

*Primary Examiner* — Melvin C Mayes
*Assistant Examiner* — Colette Nguyen
(74) *Attorney, Agent, or Firm* — John J. Piskorski

(57) ABSTRACT

UV curable compositions and methods for depositing one or more metal or metal alloy films on substrates are disclosed. The UV curable compositions contain a catalyst, one or more carrier particles, one or more UV curing agents, and one or more water-soluble or water-dispersible organic compounds. Metal or metal alloys may be deposited on the substrates by electroless or electrolytic deposition.

8 Claims, 3 Drawing Sheets

UV CURABLE CATALYST COMPOSITIONS

BACKGROUND OF THE INVENTION

The present invention is directed to UV curable catalyst compositions and methods of depositing an ultra-thin metal or metal alloy layer on a substrate. More specifically, the present invention is directed to UV curable catalyst compositions and methods of depositing an ultra-thin metal or metal alloy layer on a substrate where the UV curable catalyst has high surface area particles.

Many industries where workers desire to coat or form one or more metal or metal alloy layers on substrates employ catalysts. Such catalysts are employed in electroless deposition of metal or metal alloys. Electroless deposition or plating is based on the presence of a chemical reducing agent being added to the deposition bath. Such chemicals supply electrons to substrate metals, which transmit the electrons to the positively charged metal ions in the bath reducing these ions to metal in the same manner in which electric current reduces metal ions to metals in electrolytic or electrodeposition baths.

Electroless plating produces several desirable results. Workers often have difficulty in depositing metal layers of uniform thickness on substrates with crevices or holes using electrolytic methods of plating. This attribute is important in many industries such as in the electronics industry, in which printed circuit or printed wiring boards demand uniform metal deposits plated into high aspect-ratio through-holes. Other properties and applications of electroless plating are deposits which may be produced directly upon nonconductors, deposits in which are often less porous than electrolytic plating, and also deposits which often have unconventional chemical, mechanical or magnetic properties (such as higher hardness and wear resistance).

Another attribute of electroless plating is that the process is auto-catalytic and deposition occurs on a catalytic surface. Accordingly, a catalyst is required. Catalysts employed in electroless metal deposition vary widely in composition depending on the metal or metal alloy to be deposited as well as the use of the article made. In addition to the manufacture of printed wiring boards, electroless plating using catalysts are employed in the manufacture of various decorative articles, and in numerous other electronic applications such as in the formation of electromagnetic interference (EMI) and radio frequency interference (RFI) shielding.

EMI radiation is created by operation of many diverse forms of electronic equipment ranging from microwave equipment to home computers. The radiation occurs because electronic devices emit "noise" in a frequency range of 60 Hz to more than 1000 MHz, and is picked up by other devices or by conduction through power lines that act as antennas. EMI radiation may interfere with other devices and has been known to cause such diverse problems as interference with police mobile radios, communication systems, scientific test equipment and cardiac pacemakers.

One approach to limiting electromagnetic containment is the use of an EMI shield to contain the radiation. Containment requires special shielding materials, components, and structures, which prevent generated energy from escaping and acting as a source of disturbance.

Effectiveness of electromagnetic containment is determined by the degree to which the field strength is attenuated as a result of reflection or absorption by the shielding material. Shielding efficiency is calculated as a logarithmic function of the ratio of unshielded EMI transmission to shielded EMI transmission and is expressed in decibels (db). Because of its logarithmic nature, an increase of 30 db in shielding efficiency for a given wavelength or frequency of electromagnetic radiation represents a 1000% increase in the shielding efficiency of a coating. A coating with a shielding efficiency of 30 db, for example, eliminates 99.9% of the total EMI radiation. A 60 db coating eliminates 99.9999% of the total EMI radiation.

A number of different shielding methods have been used commercially. One method involves applying a metallic coating over a plastic housing for electronic devices. Such methods include galvanic deposition, spray coating such as by arc-spraying or spraying the metal on as a paint, cathode sputtering, chemical metallizing and vacuum metallizing. Metal coatings have included copper, silver, chromium, nickel, gold and zinc. Such methods have suffered from a number of deficiencies such as macro or microscopic cracking, peeling of coatings, limited shielding effectiveness, oxidation of metals in the coatings, distortion of thermoplastic substrates, and expensive application equipment.

A more suitable method of forming an EMI shield has been by electroless deposition of a metal on the non-conductive housing materials. Electroless deposition of non-conductors such as plastics involved immersing a part in a series of aqueous baths, which both prepare the surface of the part for deposition and permit metallization. Following conventional pretreatment steps, the part is then immersed into a catalyst containing noble metals, such as a colloidal tin/palladium catalyst, to render non-conductive surfaces catalytic to deposition of the desired plating metal. Following catalysis, the part is then immersed into an electroless plating bath containing dissolved metals which, in contact with the plating catalyst, results in deposition of a coating of the metal onto the catalyzed surface.

While the foregoing electroless catalyst and method was superior to many of the earlier methods employed to address the problem of EMI shielding, the electroless coating process was not selective. The entire part was immersed into the colloidal catalyst solution followed by immersing the part into a metal plating solution. The result was that metal was plated over the exterior as well as the interior surface of the non-conductor part. Where aesthetics are important in the marketing of electronic components, an exterior metal coated housing for the electronic component is undesirable. Typically, the industry paints the housing. This is a time consuming and wasteful step, especially where housings are most often molded in a desired color.

U.S. Pat. No. 5,989,787 discloses an alkaline, hydrophilic activating catalytic solution for selectively electroless plating of metals on a non-conductive substrate. The solution is composed of a mixture of copper lactate or zinc lactate, a palladium salt, such as palladium chloride, and an alkaline medium. The electroless plating method includes the steps of applying the hydrophilic activating catalytic solution on a substrate to form a photosensitive film on the substrate, and selectively exposing the photosensitive film to UV (ultraviolet) radiation or scanned by laser rays to deposit palladium catalyst on the substrate, developing away any un-exposed photosensitive film, and electroless plating the substrate using the palladium catalyst as an activating catalyst.

When the photosensitive film is exposed to UV radiation or scanned by laser rays, copper ions or zinc ions from the copper or zinc lactate are activated to interact with palladium ions. The palladium ions are then reduced to metallic palladium thereby depositing catalytic palladium on the substrate. The patent states that the formation of palladium lactate is important in the performance of this invention because palladium lactate is soluble in the alkaline environment. As stated in the patent the highly soluble palladium lactate permits a distinct contrast between the radiation exposed area and non-exposed area with a short time exposure to the radiation. Further, because the lactate is not likely to be subjected to hydrolytic decomposition, the un-exposed photosensitive film may be removed with water or water-based liquids without forming unnecessary compounds. One disadvantage of the composition and method disclosed in the '787 patent is the use of only palladium salts for the catalyst. Such salts are typically more expensive than other catalytic salts. Further any undeveloped palladium lactate is lost during the rinse steps resulting in the lose of costly palladium metal.

Another disadvantage of the composition and method of the '787 patent is that it does not disclose methods of adhering palladium to the substrate. Accordingly, in order to prepare the substrate for receiving the palladium, classic chromic etch methods would be used. Such chromic etch methods are undesirable because they are hazardous to workers, and any waste generated in their use is environmentally unfriendly.

Accordingly, there is still a need for an improved composition and method of forming a metal layer on a non-conductive substrate.

SUMMARY OF THE INVENTION

Compositions of the invention include a catalyst, one or more carriers having an average particle size of from 5 nm to 900 nm, one or more UV curing agents, and one or more water-soluble or water-dispersible organic compounds. The compositions do not employ organic solvents as the water-soluble or water-dispersible organic compounds provide sufficient means of adhesion for the compositions to a non-conductive substrate. Accordingly, roughening a non-conductive surface with a solvent swell is avoided when using the compositions, thus eliminating many potentially hazardous compounds from the compositions. The nano-sized carrier particles, on which the catalysts are coated, increase the effective area of the catalysts, thus permitting a continuous catalytic layer to be placed on a substrate. The catalytic layer permits electroless metals to nucleate and grow through the catalytic layer to the substrate permitting the substrate to come into electrical contact with deposited metal. Further, the compositions are UV curable enabling rapid throughput and, with the use of a suitable developer, the creation of discrete patterns and clearly demarcated metallized areas. Such imaging of the catalytic layer can be used to create, for example, waveguides, antenna for electronic devices and to enable the creation of tracks for electronic circuitry.

Another embodiment is directed to a method of depositing a metal or metal alloy on a substrate that includes applying a UV curable catalytic composition to the substrate, the catalytic composition includes a catalyst, one or more carriers having an average particle size of from 5 nm to 900 nm, one or more UV curable agents, and one or more water-soluble or water-dispersible organic compounds; and depositing a metal or metal alloy on the substrate with the catalytic composition.

An additional embodiment is directed to an article made with the UV curable compositions comprising a substrate having one or more metal or metal alloy layers and a resistance of 50 m$\Omega$/cm$^2$ or less. Articles made with the compositions and methods may be employed in numerous electronic devices, for example, such as in printed circuit or wiring boards including embedded passives such as resistors and capacitors, for EMI shielding, RFI shielding, optoelectronic devices, for polymer or ceramic fibers for ESD clothing, and decorative features on various articles. The compositions and methods may be employed in any industry where metal deposition is employed.

DETAILED DESCRIPTION OF THE DRAWINGS

Figure 1:
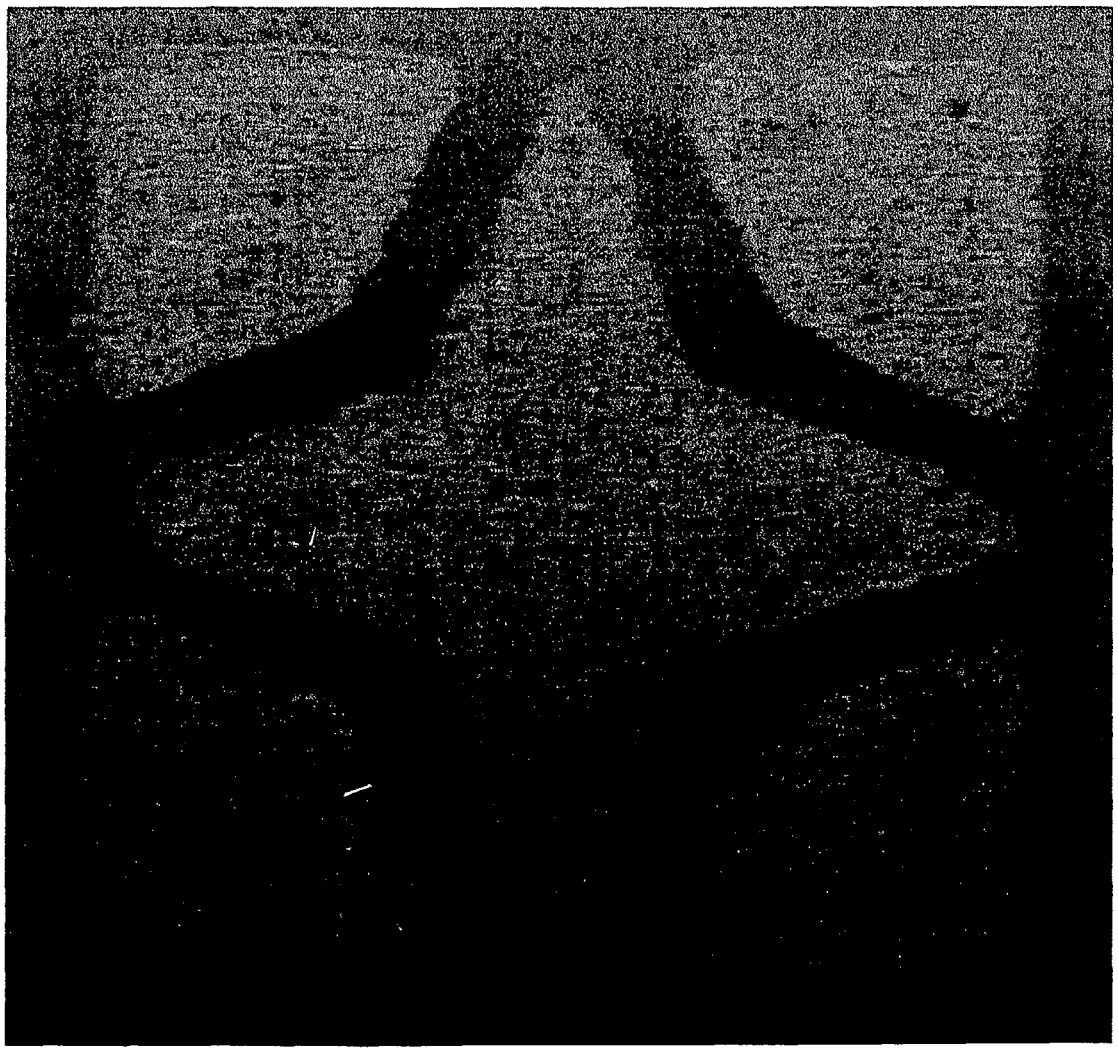
FIG. 1 is a SEM at 2000× of copper selectively deposited with a UV cured catalyst on an FR4 substrate.

As used throughout the specification, the following abbreviations have the following meaning, unless the context clearly indicates otherwise: ° C.=degrees Centigrade; gm=gram; mg=milligram; L=liter; mL=milliliter; A=amperes; m=meters; dm=decimeter; mm=millimeters; μm=micron=micrometer; cm=centimeter; nm=nanometers; m$\Omega$=milliohms; cps=centipoise; kV=kilovolts; SEM=scanning electron micrograph; terms "plating" and "depositing" are used interchangeably throughout the specification; terms "printed wiring board" and "printed circuit board" are used interchangeably throughout the specification; "film" and "layer" are used interchangeably throughout the specification; "water-soluble" within the scope of the present invention means that a compound or polymer swells or dissolves in water at normal temperatures (from above 0° C. to 100° C. at 1 atmosphere pressure); "water-dispersible" within the scope of the present invention means that a compound or polymer forms an emulsion, micro-emulsion or suspension in water at normal temperatures. All numerical ranges are inclusive and combinable in any order, except where it is logical that such numerical ranges are constrained to add up to 100%.

Compositions include catalysts in the form of hydrous oxides or hydroxides of catalytic metals dispersed in an aqueous diluent with one or more inert carrier or filler particles, one or more UV (ultra-violet) curing agents, and one or more water-soluble or water-dispersible organic compounds. Inert carrier or filler particles are not believed to participate in the catalytic reactions during metal or metal alloy deposition. The compositions form aqueous slurries.

Hydrous oxides or hydroxides of catalytic metals may be formed by any suitable method known in the art. For example, metal hydrous oxides may be formed by preparing an aqueous solution of a salt of a desired metal with agitation, pH adjustment and heat as needed to obtain dissolution of the metal salt. Thereafter a hydrolysis and nucleation reaction is permitted or caused to take place at a controlled rate within the solution. The reaction takes place until a hydrous oxide is formed in situ. The hydrolysis reaction is permitted to continue until the solubility limit of the solution is exceeded to form a separate dispersed phase. Such methods are well known by those of skill in the art.

Any suitable metal, which forms a hydrous oxide or hydroxide and has catalytic properties, may be employed to practice the present invention. Examples of suitable metals include silver, gold, platinum, palladium, indium, rubidium, ruthenium, rhodium, osmium, and iridium. Examples of other catalytic metals include copper, cobalt, nickel, and iron (in the ferric oxidation state). Typical catalytic metals include silver, gold, and platinum. More typically, silver, and gold are the choice of noble metals, and most typically, silver is the choice for the catalytic metal. The foregoing list of metals is not exhaustive and any metal that forms a hydrous oxide or hydroxide and has catalytic properties with respect to the metal or metal alloy to be deposited may be employed to practice the present invention.

Choosing a metal catalyst depends on the metal or metal alloy to be deposited on a substrate. In electroless deposition of a metal or metal alloy, the oxidation/reduction potential of the catalytic metal is more electropositive ('noble') than that of the metal or metal alloy to be deposited. For example, the following metals are reported to be catalytic to the deposition of copper, copper alloy, nickel, nickel alloy, and cobalt: silver, tellurium, platinum, thallium, vanadium, gold, germanium, selenium, iron, and palladium, with gold, platinum and silver typically employed. More typically silver and gold are employed to deposit copper or an alloy of copper. Most typically silver is employed to deposit copper or a copper alloy.

The catalyst in the form of a metal hydrous oxide or metal hydroxide is mixed with one or more inert carriers to form an aqueous slurry. Inert carriers employed may be any suitable water-insoluble compound having an average particle diameter such as from 5 nm to 900 nm, or such as from 20 nm to 600 nm, or such as from 50 nm to 500 nm. While not being bound by theory, the catalytic metals as their hydrous oxides or hydroxides are adsorbed onto the inert carrier particles, thus increasing the effective catalytic area of the catalysts, which allows the metal catalysts to come into more intimate contact with a plating bath than with carrier particles of greater average sizes. This intimate contact is believed to enable formation of ultra-thin catalytic films. Such catalytic films, when dry, range in thickness of from 10 nm to 10 microns or such as from 50 nm to 10 microns. Metal ions depositing as metal are believed to nucleate through the catalytic composition to form an electrical contact with the substrate, and form a continuous metal or metal alloy film over the substrate. Such nucleation is of value in many applications such as, for example, when constructing electrical traces in a printed wiring board, solder-pads for chip-capacitors, capacitors, or electrical components in general where electrical contact is desired.

Suitable carriers include, but are not limited to, various water-insoluble salts and minerals or mixtures thereof. Examples of such suitable inert carriers include, but are not limited to, compounds of multi-valent cation and anion pairs, metal oxides, silicates, silica or mixtures thereof. The inert carriers are included in slurries of the present invention in amounts such as from 30 times the weight of catalytic metal in the hydrous oxide or hydroxide compound and greater, or such as from 55 to 330 times the weight of the catalytic metal in the hydrous oxide or hydroxide compound, or such as from 60 to 300 times the weight of the catalytic metal. Surface areas of ultra-fine inert carrier particles may range from 0.5 $m^2/gm$ to 3000 $m^2/gm$ or such as from 50 $m^2/gm$ to 2000 $m^2/gm$, or such as from 100 $m^2/gm$ to 1000 $m^2/gm$ or such as from 200 $m^2/gm$ to 800 $m^2/gm$.

Examples of suitable compounds of multi-valent cation and anion pairs include, but are not limited to, water-insoluble salts of barium, calcium, magnesium, and manganese such as barium sulfate, calcium hydroxide, magnesium hydroxide, manganese hydroxide, or mixtures thereof. Barium salts and calcium salts are more typically employed such as barium sulfate or calcium hydroxide or mixtures thereof. Barium salts such as barium sulfate are most typically employed.

Examples of suitable metal oxides include, but are not limited to, iron oxide, aluminum oxide, titanium dioxide, calcium carbonate, zinc oxide, magnesium oxide cesium oxide, chromium oxide, hafnium oxide, zirconium oxide, or mixtures thereof. Aluminum oxide, calcium carbonate, zinc oxide, or mixtures thereof are more typically employed. Aluminum oxide, calcium carbonate or mixtures thereof are the most typically employed oxides.

Examples of suitable silicates include, but are not limited to, gemstones (except diamond), beryl, asbestos, clays, feldspar, mica, talc, zeolites, both natural and synthetic zeolites, or mixtures thereof. Examples of natural zeolites include analcite, chabazite, heulandite, natrolite, stilbite and thomosonite. Zeolites, clays, micas or mixtures thereof are more typically employed silicates.

Any suitable water-soluble or water-dispersible organic compound may be employed in the slurries of the present invention. The organic compounds are believed to perform as binders for the catalysts and carrier particles. While not being bound by theory, the organic compounds are believed to bind to the substrates by hydrogen bonding, ionic bonding, covalent bonding, van der Waals forces or combinations thereof. Other types of chemical bonds and electrostatic forces may be involved. The bonding ability of the organic compounds with the substrate eliminates the need for a solvent to swell or roughen a substrate surface. Accordingly, many undesirable solvents that are toxic to workers and a hazard to the environment are excluded from the compositions of the present invention.

Examples of suitable water-soluble or water-dispersible organic compounds include, but are not limited to, polyurethanes and epoxides or mixtures thereof. Other suitable water-soluble or water-dispersible organic compounds include, but are not limited to, polymers such as acrylic homopolymers or copolymers, lactic acid homopolymers or copolymers, polyamides, polyesters, alkyd resins, ethylene copolymers with acrylates or vinyl acetate, chlorinated or unchlorinated homopolymers or copolymers of vinyl chloride, vinyl acetate or vinyl proprionate, cyclisized or chlorinated rubber, nitrocellulose, ethyl or ethylhydroxy cellulose, coumarine-indene resins, terpene resins, polyvinyl acetal resins, cellulose esters such as cellulose acetobutyrate and cellulose acetoproprionate, shellac, poly alkylglycols, starch, carbohydrates and other natural resins singularly or in combination. Additionally, fine-sized ion exchange materials may be used as dispersants. For example, suitable ion exchange resins include those with olefinic, styrenic, acrylic and vinyl backbones, which contain quaternary amine groups, aminoacetic, carboxylic and sulfonic functionality. Such organic compounds compose from 5 wt. % to 60 wt. % or such as from 10 wt. % to 45 wt. % or such as from 20 wt. % to 35 wt. % of the catalytic composition.

Examples of suitable polyurethanes include, but are not limited to, aqueous based, polyurethane compositions. Such compositions may be ionic aqueous dispersions of polyurethane containing ionic or hydrophilic functional groups as well as hydrophobic polyolefin segments in the backbone. The dispersions may be cationic or anionic. Such aqueous dispersions are known in the art and are commercially available and may be made by various methods disclosed in the literature.

An example of one method of preparing aqueous based, polyurethane-polyolefin dispersions includes rendering isocyanate-terminated polyurethane prepolymers water-dispersible by including in the prepolymer chain an effective amount of water-dispersing pendent carboxylic or cationic salt groups or combinations thereof. Typically, pendent carboxylic or cationic groups compose from 0.5 wt. % to 10 wt. % of the prepolymer. Methods of forming such prepolymers are well known to those of skill in the art. Examples of preparing such prepolymers and aqueous based, polyurethane-polyolefin dispersions are disclosed in U.S. Pat. No. 4,644,030. Alternatively, the prepolymer may be devoid of carboxylic or cationic salt groups in which case the prepolymer is dispersed in water with the aid of a dispersing agent, such as one or more non-ionic surfactant.

Isocyanate-terminated polyurethane prepolymers may be prepared by any suitable method known in the art. Many methods are disclosed in the literature. An example of a method of preparing an isocyanate-terminated polyurethane prepolymer involves reacting organic material containing an average of at least 2 active hydrogen atoms per molecule, such as a diol or a polyester polyol, with a stoichiometric excess of an organic diisocyanate. Many such organic diisocyanates suitable for making isocyanate-terminated polyurethane prepolymers are well known in the art and many are commercially available. The organic material may contain at least one unreactive pendent carboxylic group in salt form or neutralized with a suitable basic material to salt form during or after prepolymer formation. An example of such carboxylic-containing reactant is an alpha, alpha dimethylol ($C_2$ to $C_{10}$) alkanoic acid, such as 2,2-dimethylol propionic acid.

In addition to polyester polyols, other polyols or mixtures thereof may be employed and include, but are not limited to, poly-caprolactone, polycarbonate, polybutadiene resins (hydroxyl terminated homopolymers of butadiene), polyethers based on ethylene oxide, propylene oxide and tetrahydrofuran, or mixtures thereof.

Examples of suitable polyisocyanates include, but are not limited to, methylene bis isocyanato-cyclohexane, ethylene diisocyanate, propylene diisocyanate, butylene-1,3-diisocyanate, 1,6-hexamethylene diisocyanate, 2,2,4-trimethyl-hexamethylene diisocyanate, 2,4-dimethyl-6-ethyloctamethylene diisocyanate, cyclohexylene diisocyanate, cyclopentylene diisocyanate, 1,4-diisocyanatomethyl-cyclohexane, 1,3-diisocyanatoethyl-cyclohexane, toluylene diisocyanate, 3,3,5-trimethyl-1-isocyanato-5-isocyantomethyl-cyclohexane, 2-butene-1,4-diisocyanate, isophorone diisocyanate, 1,6-hexamethylene diisocyanate biuret, 1,6-hexamethylene diisocyanate trimer, isophorone diisocyanate trimer, bis phenol A dimethacrylate capped with 2-hydroxyethylmethacrylate capped with 1,6-hexamethylene diisocyanate trimer, or mixtures thereof.

Many of the foregoing diisocyanates may be purchased from Lyondell (located in Houston, Tex.) or Bayer (located in Pittsburgh, Pa.). Additional examples of commercially available polyisocyanates include MONDUR CB (adduct of 3 moles toluene diisocyanate with 1 mole trimethylol propane, Mobay Chem.), DESMODUR-N (trifunctional biuret of 1,6-hexane diisocyanate, Mobay Chem.), ISONATE 143 L (polymeric diisocyanate bis phenyl isocyanate, Upjohn).

Optionally, a suitable proportion of the organic active hydrogen-containing reactant material or the organic isocyanate reactant material contains at least one ethylenically unsaturated group, such proportion is sufficient to include from 0.5 wt. % to 60 wt. % or more units derived from such unsaturated group-containing reactants in the urethane polymer. Such groups provide cross-linking capability when subjected to subsequent in situ vinyl addition polymerization conditions for polymerizing liquid inert monomer material in the polyurethane dispersion. The organic reactant material for this purpose may be provided with these unsaturated groups in any suitable form or linkages, e.g. ether, ester, or carbon-to-carbon linkages. Examples of such active hydrogen-containing materials include, but are not limited to, glycerol mono allyl ether, glycerol methacrylate, N,N-dimethylol-1 butene, hydroxy terminated poly (butadiene), hydroxyethylacrylate, hydroxypropylacrylate, or mixtures thereof. Examples of such isocyanate-containing reactants include, but are not limited to, 2-methyl-5-vinylbenzene-1,4-diisocyanate and 1-(α-isocyanato-α-methyl) ethyl-3 (α-methyl) ethenyl benzene (m-TMI, Amer. Cyanamid). Ethylenic unsaturation may appear in pendent groups along the polyurethane chain, in terminal groups, or internally as links in the chain or any combination thereof.

The synthesis of isocyanate-terminated polyurethane prepolymer may be carried out in the presence of inert liquid polymerizable ethylenically unsaturated monomer material. Such monomer materials are well known in the art, yielding polyolefins (including substituted polyolefins) or "vinyl addition polymers", i.e. by the addition polymerization of one or a mixture of monomers containing one or more internal terminal polymerizable ethylenically unsaturated groups. This type of polymerization is known as suspension polymerization and is carried out in the presence free radical vinyl polymerization catalysts or redox systems where the monomers add to each other at ethylenic double bonds to produce polymer chains composed predominantly of carbon atoms.

Monomer materials typically are liquid under the prepolymer-forming reaction conditions. The monomer materials function as the solvent, diluent or carrier medium. Optionally, organic solvents may be added to the reaction medium. Examples of suitable monomers include, but are not limited to, polymerizable ethylenically unsaturated hydrocarbons, carboxylic acids, esters and ethers, such as free acids and esters of acrylic and methacrylic acid, esters and ethers of vinyl alcohol, and styrene. Illustrative examples include butadiene, isoprene, styrene and substituted styrenes, the free acids and lower alky ($C_1$ to $C_6$) esters of acrylic, methacrylic acid and maleic acid, vinyl acetate, butyrate, acrylate and methacrylate, hexanediol, diacrylate, vinyl methyl, propyl and butyl ethers, divinyl ether, divinyl sulfide, trimethylol propane triacrylate, 2-butene-1,4-diol diacrylate, or mixtures thereof.

The foregoing illustrative examples of suitable monomeric material include both mono- and poly-ethylenically unsaturated materials, the latter providing cross-linking capability under vinyl addition polymerization conditions. Polyunsaturated materials, include, but are not limited to, di-ethylenically unsaturated materials and when employed may be mixed in minor amounts with mono-ethylenically unsaturated materials, i.e. in amounts ranging from 1 to less than 50 wt. % of the polymerizable ethylenically unsaturated monomers. The monomer material may be composed of one or a mixture of such mono-ethylenically unsaturated material.

In addition to the inclusion in the prepolymer chain of pendent anionic carboxylic salt groups, a desired water-dispersibility may alternatively be provided by the inclusion in the chain of an equivalent proportion, i.e. an effective amount, of pendent water-dispersing cationic salt groups. Such cationic salt groups include, but are not limited to, quaternary ammonium groups, insertable, for example, by employing a suitable proportion of an active hydrogen-containing organic reactant containing a tertiary amine or alkyl halide group and subsequently quaternizing these groups by reaction with, respectively, an alkyl halide or a tertiary amine. Organic or inorganic acid salts of tertiary amine groups in the prepolymer also are effective water-dispersing cationic salt groups.

The prepolymer may undergo conventional chain extension followed by vinyl addition polymerization with polymerizable ethylenically unsaturated monomer material to polymerize the monomer material in situ. Such methods are well known in the art. An example of suitable chain extenders is polyamines such as aliphatic polyamine, which are reactive with isocyanate groups. Completion of polymerization is indicated by a constant solids content ranging from 20 wt % to 60 wt %. The aqueous dispersions have a pH of from 7 to 9.5 when anionic and from 2 to 10 when cationic. Viscosities range from 25 to 200 cps at from 18° C. to 25° C.

Examples of suitable water-dispersible or water-soluble epoxy resins include, but are not limited to, epoxy resins produced from various phenols such as bisphenol A, bisphenol F, bisphenol S, bisphenol AD, hydroquinone, resorcin, methyl resorcin, bisphenol, tetramethyl biphenyl, dihydroxynaphthalene, tetrabromobisphenol A, dihydroxydiphenyl ether, dihydroxydibenzophenone, dihydroxydiphenyl sulfone phenol novolak resin, cresol novolak resin, bisphenol A novolak resin, dicyclopentadiene phenol resin, terpene phenol resin, phenol aralkyl resin, naphthol novolak resin or brominated phenol novolak resin, or various phenol-type compounds such as polyhydric phenol resins obtained by condensation reactions of various phenols and various aldehydes, such as hydroxybenzaldehyde, crotonaldehyde or glyoxal, and epihalohydrin. Also, for example, epoxy resins produced from various amine compounds such as diaminodiphenyl methane, aminophenol or xylene diamine, and epihalohydrin. Epoxy resins produced from various carboxylic acids also may be employed such as methylhexahydroxyphthalic acid or dimmer acid, and epihalohydrin. Mixtures of the various epoxy resins may be employed. Many of the foregoing epoxy resins are commercially obtainable or may be prepared by methods disclosed in the literature.

Typically, epoxy resins derived from bisphenol A, bisphenol S, bisphenol F or novolak resins, or epoxy resins obtained by reaction of bisphenol A and epihalohydrin, or mixtures thereof are employed. More typically, epoxy resins derived from bisphenol A, novolak resins or epoxy resins obtained by reaction of bisphenol A and epihalohydrin are employed, or mixtures thereof. Most typically, epoxy resins derived from bisphenol A are used.

Any suitable compound which cures the compositions upon exposure to UV radiation may be used. Examples of such compounds include onium salts and compounds which generate a free-radical upon exposure to UV radiation. UV curing agents may be used in amounts of 0.1 wt % to 15 wt % of the composition, or such as from 1 wt % to 10 wt %, or such as from 3 wt % to 7 wt %.

Suitable onium salts include, but are not limited to, onium salts in which the onium cation is iodonium or sulfonium such as onium salts of arylsulfonyloxybenzenesulfonate anions, phosphonium, oxysulfoxonium, oxysulfonium, sulfoxonium, ammonium, diazonium, selenonium, arsonium, and N-substituted N-heterocyclic onium in which N is substituted with a substituted or unsubstituted saturated or unsaturated alkyl or aryl group.

The anion of the onium salts may be, for example, chloride, or a non-nucleophilic anion such as tetrafluoroborate, hexafluorophosphate, hexafluoroarsenate, hexafluoroantimonate, triflate, tetrakis-(pentafluorophosphate) borate, pentafluoroethyl sulfonate, p-methyl-benzyl sulfonate, ethylsulfonate, trifluoromethyl acetate and pentafluoroethyl acetate.

Examples of typical onium salts include, for example, diphenyl iodonium chloride, diphenyliodonium hexafluorophosphate, diphenyl iodonium hexafluoroantimonate, 4,4'-dicumyliodonium chloride, dicumyliodonium hexafluorophosphate, N-methoxy-a-picolinium-p-toluene sulfonate, 4-methoxybenzene-diazonium tetrafluoroborate, 4,4'-bis-dodecylphenyliodonium-hexafluoro phosphate, 2-cyanoethyl-triphenylphosphonium chloride, bis-[4-diphenylsulfonionphenyl]sulfide-bis-hexafluoro phosphate, bis-4-dodecylphenyliodonium hexafluoroantimonate and triphenylsulfonium hexafluoroantimonate.

Photoinitiator chemicals include, but are not limited to, n-phenyl glycine, aromatic ketones (benzophenone, N,N'-tetramethyl-4,4'-diaminobenzophenone [Michler's ketone], N,N'-tetraethyl-4,4'-diaminobenzophenone,4-methoxy-4'-dimethylaminobenzophenone, 3,3'-dimethyl-4-methoxybenzophenone, p,p'-bis(dimethylamino)benzophenone, p,p'-bis (diethylamino)-benzophenone, anthraquinone, 2-ethylanthraquinone, naphthaquinone, phenanthraquinone, benzoins (benzoin, benzoinmethylether, benzoinethylether, benzoinisopropylether, benzoin-n-butylether, benzoin-phenylether, and methylbenzoin, ethybenzoin), benzyl derivatives (dibenzyl, benzyldiphenyldisulfide, and benzyldimethylketal (SIC)), acridine derivatives (9-phenylacridine, 1,7-bis (9-acridinyl)heptane), thioxanthones (2-chlorothioxanthone, 2-methylthioxanthone, 2,4-diethylthioxanthone, 2,4-dimethylthioxanthone, and 2-isopropylthioxanthone), acetophenones (1,1-dichloroacetophenone, p-t-butyldichloroacetophenone, 2,2-diethoxyacetophenone, 2,2-dimethoxy-2-phenylacetophenone, and 2,2-dichloro-4-phenoxyacetophenone).

Optionally, surfactants may be added to the catalytic compositions of the present invention provided that they do not interfere with the catalysis of metal deposition. Suitable surfactants include cationic, anionic, amphoteric, non-ionic or mixtures thereof. Surfactants are included in conventional amounts. Examples of suitable non-ionic surfactants are ethylene oxide/propylene oxide copolymers sold by BASF under the Pluronic® and Tetronic® tradenames.

Optionally, coalescing agents may be added to the catalytic compositions. Any suitable coalescing agent may be added to the catalytic compositions. Examples of suitable coalescing agents include, but are not limited to, glycols and glycol ethers or mixtures thereof. Coalescing agents are employed in conventional amounts.

Optionally, additional adhesion promoting organic compounds may be included in the catalyst compositions of the present invention. Examples of such adhesion promoting compositions include, but are not limited to, triazines, phenols, aldehydes, acrylic esters, imidazoles, acrylamide, benzotriazole, malonates, acetoacetates, chlorinated polyolefins, urethanes such as Eastman Chemical AP 440-1, epoxybutene, glycidyl methacrylate, alkoxysilane compounds such as β-(3, 4-epoxycyclohexyl) ethyltriethoxysilane, bis(trimethoxysilylpropyl)amine, γ-aminopropyltrimethoxy silane and aminoalkyl siloxanes.

Components of the WV curable catalytic compositions of the present invention may be mixed together by any suitable means known in the art. One method is to utilize high-shear dispersion to coat the ultra-fine inert filler with a catalyst and then to add resin to the filler under low-shear agitation. Suitable shear rates are well within the ability of a person of skill in the art and minor experimentation may be performed to determine optimum shear rates for a given composition. Mixing may be carried out at temperatures of, for example, such as from 15° C. to 35° C., more typically from 18° C. to 25° C. The mixture of components results in an aqueous slurry, which may be applied to a substrate by any suitable means known in the art. For example, the slurry may be applied by immersing a substrate into the slurry or the slurry may be sprayed onto the substrate using a suitable spray apparatus such as an air gun. Brushing and screening are other examples of methods of applying the catalytic compositions. Optionally, a mask or a tool having a desired pattern may be applied to the substrate prior to applying the catalytic composition such that the catalytic composition is selectively deposited on the substrate, thus a metal or metal alloy film may be selectively deposited on the substrate during the plating process.

Alternatively, the entire substrate may be coated with the catalyst and dried on the substrate. A mask or photo-tool with a desired pattern may then be applied to the dried catalyst. The coated substrate with the photo-tool is then exposed to UV radiation to cure the exposed portions of the catalyst. The photo-tool is then removed and a suitable developer is applied to the substrate to remove the un-exposed portions of the catalyst. Any suitable developer may be used. Examples of such developers include water, aqueous based liquids such as aqueous bases, and mono-alcohols such as methyl, ethyl, propyl, isopropyl, polyols and mixtures thereof. Other suitable developers include N-methyl pyrrolidone, butyl methacrylate, and mixtures thereof.

A wet film of from 0.5 to 30 microns is formed on a substrate surface, or such as from 1 to 20 microns or such as from 5 to 15 microns. The wet film is then allowed to dry. Drying may be performed by any suitable method. An example is to let the film air-dry. Air-drying may take from 20 minutes to 2 hours, more typically from 60 minutes to 90 minutes. However, drying time may be shorter or longer depending on the ambient conditions of the drying room. Dry film weight may range from 0.5 gm/m$^2$ to 10 gm/m$^2$, or such as from 1 gm/m$^2$ to 5 gm/m$^2$.

Catalyst compositions of the present invention may be applied to any suitable substrate. Examples of such substrates include, but are not limited to, nonconductors such as plastics, which may be thermoplastic or thermosetting resins. Exemplary thermoplastic resins include, but are not limited to, general-purpose plastics such as PE (polyethylene), PVC (polyvinyl chloride), PS (polystyrene), PP (polypropylene), ABS (acrylonitrile-butadiene-styrene), AS (acrylonitrile-styrene), PMMA (polymethyl methacrylate), PVA (polyvinyl acetate), PVDC (polyvinylidene chloride), PPO (polyphenylene oxide), and PET (polyethylene terephthalate); general-purpose engineering plastics such as PA (polyamide), POM (polyacetal), PC (polycarbonate); PPE (modified polyphenylene ether), PBT (polybutylene terephthalate), GE-PET (glass fiber reinforced polyethylene terephthalate) and UHPE (ultrahigh-molecular weight polyethylene); and super-engineering plastics such as PSF (polysulfone), PES (polyethersulfone), PPS (polyphenylene sulfide), PAR (polyarylate), PAI (polyamideimide), PEEK (polyetheretherketone), PI (polyimide) and fluorocarbon resins. Exemplary thermosetting resins include, but are not limited to, phenolic resins, urea resins, melamine resins, alkyd resins, unsaturated polyesters, epoxy resins, diallyl phthalate polymers, polyurethanes and silicone resins.

Other materials that may be employed as substrates in practicing the present invention include, but are not limited to, rubbers, ceramics in general including ceramic fibers, silicates, glass including non-silicate glass and glass fibers, wood, fiber-reinforced plastics, textiles, and paper.

After the catalytic composition (also known in the art as a primer) has dried on the substrate, the dried primer is cured using any suitable UV curing procedure and source of UV radiation. Optionally, the dried primer and the substrate may be baked at temperatures of from 30° C. to 100° C., or such as from 40° C. to 80° C. Baking may range from 5 minutes to 60 minutes, or such as from 10 minutes to 30 minutes. Many such procedures are known in the art. One method is to expose the substrate with the dried primer to UV rays from an excimer-lamp at wavelengths of from 170 nm to 400 nm, or such as from 200 nm to 375 nm. UV curing may be performed at any suitable temperature. For example UV curing may be performed at temperatures of from 18° C. to 40° C. or such as from 20° C. to 30° C. The time period for UV curing may range from 2 seconds to 60 seconds, or such as from 15 seconds to 30 seconds.

After curing, a metal or metal alloy may be deposited on the catalyst composition by any suitable method known in the art. If the catalyst composition was applied to the substrate using a patterned tool or mask, the metal or metal alloy is selectively deposited. Typically, metals are deposited on the primed substrate by electroless metal deposition. A substrate with a cured primer is sprayed with an electroless bath or is immersed in the bath for a sufficient amount of time to deposit a continuous metal or metal alloy film on the substrate. Such procedures are well known in the metal plating industry.

Any metal that may be deposited by electroless deposition may be employed to practice the present invention. Examples of suitable metals that may be electrolessly deposited using the catalyst compositions include, but are not, limited to copper, nickel, cobalt, chromium, iron, tin, lead, aluminum, magnesium, chromium, vanadium, zinc, and their alloys. Examples of alloys that may be employed to practice the present invention include, but are not limited to, copper/nickel, copper/silver, copper/tin, copper/bismuth, tin/silver, tin/lead, nickel/vanadium, nickel/boron, nickel/phosphorous, cobalt/phosphorous, and nickel/cobalt/phosphorous. Other metals that may be deposited using the catalyst compositions include, but are not limited to, gold, silver, platinum, palladium, indium, rhodium, ruthenium, iridium, osmium, and their alloys. Typically, copper, nickel, cobalt, lead, gold, silver, platinum, palladium and their alloys are deposited using the catalyst compositions, more typically copper, nickel, gold, platinum, palladium and their alloys. Most typically copper and copper alloys are deposited using the catalyst compositions.

Electroless plating baths for depositing a metal or metal alloy on a substrate are well known in the art and vary in composition. As an example electroless metal plating baths may contain one or more diluent-soluble metal salts as a source of the metal or metal alloy to be deposited, complexing agents, chelating agents, reducing agents, stabilizers, and brighteners. Other components may be included in such electroless baths as are well known to those of skill in the art.

Continuous metal or metal alloy films deposited using the catalytic compositions may vary in thickness such as from 10 nm to 10 microns or such as from 0.1 microns to 5 microns, or such as from 0.5 microns to 2 microns.

Surface resistance of the metal or metal alloy films may vary. Such surface resistance may be from 50 mΩ/m$^2$ or less, or such as from 0.05 mΩ/m$^2$ to 30 mΩ/m$^2$, or such as from 1 mΩ/m$^2$ to 15 mΩ/m$^2$.

Surface hardness of the metal or metal alloy film may vary. Typically surface hardness, as measured by ASTM D3363, ranges from 6B to 6H, with higher hardness's (3H or higher) more typical in order to protect the integrity of metal or metal alloy layers during post-plating assembly where damage to the continuity of the layers may occur. Such hardness is desirable as for EMI shielding where holes or cracks in the metal may compromise the shielding performance of the metal layer. The ASTM D3363 procedure is well known in the art and hardness is tested with pencils having varying graphite hardness.

Articles made with the catalyst compositions and methods may be employed in numerous electronic devices, for example, such as in printed circuit or wiring boards including embedded passives such as resistors and capacitors, for EMI shielding, RFI shielding, optoelectronic devices, for polymer or ceramic fibers for ESD clothing, and decorative features on various articles.

Optionally, metal and metal alloy films deposited by catalysts and methods disclosed herein may be further metallized with one or more additional metal or metal alloy layers. Such additional metal layers or metal alloy layers may range in thickness from 0.5 microns and higher, or such as from 10 microns to 20 microns. Such additional metal or metal alloy layers may be deposited by electroless metal deposition or by electrolytic deposition. Electroless metal deposition also includes immersion metallization methods. Such additional metallization methods are well known in the art.

Electroless metals that may be deposited include, but are not limited to, copper, nickel, cobalt, chromium, magnesium, aluminum, bismuth, lead, vanadium, iron, tin and their alloys. Other metals include, but are not limited to, gold, silver, palladium, platinum, rhodium, ruthenium, osmium, iridium, and their alloys. Examples of suitable metals that may be plated by immersion processes include, but are not limited to, gold and silver.

The following examples are included for illustration of some embodiments of the invention. They are not intended to limit the scope of the invention.

Example 1

A UV Catalytic Primer of Hydrous Oxide of Silver

A stock solution of hydrated silver hydroxide is prepared by mixing 50 gm of silver nitrate ($AgNO_3$) with 10 gm of sodium hydroxide (NaOH) at room temperature (18° C. to 20° C.), which forms a brown precipitate of hydrated silver oxide. The precipitate is allowed to settle and then is washed with a sufficient amount of deionized water to bring the pH to 9.

0.1 gm of the hydrated silver oxide is then added to an aqueous composition containing 2.5 gm of barium sulfate ($BaSO_4$) having an average particle size of 300 nm, 0.25 gm of iron oxide ($Fe_2O_3$) having an average particle size of 550 nm and 8.75 gm of water. The solids are dispersed in the water under high-shear agitation using a stirring apparatus. 1.2 gm of an aqueous emulsion of Bisphenol-A epoxy resin with an average molecular weight of 1300 equivalent weights is then added and mixed under low-shear using a stirring apparatus until a uniform slurry was formed.

A suspension of 0.3 gm of oxysulfonium containing onium salt UV curing agent, 0.1 gm of propylene glycol methyl ether and 1 gm of water are mixed with the slurry containing the hydrous silver oxide until all of the components formed a uniform slurry. The ratio of inert filler to metal catalyst was 30 to 1.

Example 2

A UV Catalytic Primer of Hydrous Oxide of Silver 0.045 gm of the stock hydrated silver oxide from Example 1 is added to an aqueous composition containing 2.5 gm of barium sulfate ($BaSO_4$) having an average particle size of 300 nm, 0.15 gm of iron oxide ($Fe_2O_3$) having an average particle size of 550 nm, 0.5 gm di(ethylene glycol) butyl ether, 1 gm of diphenyl iodonium chloride, and 9 gm of water. The solids are dispersed in the water using high-shear agitation. 0.8 gm of an aqueous-dispersed polyurethane resin containing hydrophobic segments in its backbone and 0.01 gm of an alkoxysilane cross-linker are added to the slurry using low-shear agitation. The ratio of inert filler to metal catalyst is 65 to 1.

Example 3

A UV Catalytic Primer of Hydrous Oxide of Silver 0.045 gm of the stock hydrated silver oxide from Example 1 is added to an aqueous composition containing 3.6 gm of barium sulfate ($BaSO_4$) having an average particle size of 300 nm, 0.25 gm of iron oxide ($Fe_2O_3$) having an average particle size of 550 nm, 0.5 gm di(ethylene glycol) butyl ether, 0.5 gm of diphenyl iodonium hexafluorophosphate, and 6 gm of water. The solids are dispersed in the water using high-shear agitation. 0.8 gm of an aqueous-dispersed polyurethane resin containing hydrophobic segments in its backbone is added to the slurry using low-shear agitation. The ratio of inert filler to metal catalyst is 94 to 1.

Example 4

A UV Catalytic Primer of Hydrous Oxide of Silver 0.043 gm of the stock hydrated silver oxide from Example 1 is added to an aqueous composition containing 4.5 gm of iron oxide ($Fe_2O_3$) having an average particle size of 550 nm, 0.5 gm di(ethylene glycol) butyl ether, 0.5 gm of n-phenyl glycine, and 6 gm of water. The solids are dispersed in the water using high-shear agitation. 0.8 gm of an aqueous-dispersed polyurethane resin containing hydrophobic segments in its backbone and 0.01 gm of an alkoxysilane cross-linker is added to the slurry using low-shear agitation. The ratio of inert filler to metal catalyst is 114 to 1.

Example 5

Copper Film Surface Resistivity

Hydrous silver oxide is prepared by combining 50 gm of silver nitrate in one liter of water and then mixing with a sufficient amount of sodium hydroxide to bring the pH of the mixture to 9 to form a brown precipitate of hydrous silver oxide.

The hydrous silver oxide is filtered and then washed with deionized water. 0.045 gm of this hydrous silver oxide are then added to an aqueous composition containing 2.5 gm of barium sulfate ($BaSO_4$) having an average particle size of 300 nm, 0.15 gm of iron oxide ($Fe_2O_3$) having an average particle size of 550 nm, 0.5 gm di(ethylene glycol) butyl ether, 0.5 gm of triphenyl sulfonium hexafluoroantimonate and 9 gm of water. The solids are dispersed in the water using high-shear agitation. 0.8 gm of an aqueous-dispersed polyurethane resin containing hydrophobic segments in its backbone are then added using low-shear agitation.

Six ABS coupons are coated with the hydrous silver oxide catalyst using an air gun to deposit the catalyst on the ABS to form dry catalytic layers of 1 gm/m$^2$, 2 g/m$^2$, 3 g/m$^2$, 5 g/m$^2$, 6 g/m and 8 g/m$^2$. Curing is done using an excimer YAG (365 nm) laser. Each coupon is then plated with 1.5 microns thick copper film using Coppermerse® 80 copper electroless plating bath (obtainable from Rohm and Haas Electronic Materials LLC, Marlborough, Mass.). Plating is done at 40° C. for 40 minutes to form a 1.5 microns thick film on each coupon.

A second set of six ABS coupons are coated with the hydrous silver oxide catalyst using an air gun to deposit the catalyst on the ABS to form dry catalytic layers of 1 gm/m$^2$, 2 gm/m$^2$, 3 gm/m$^2$, 4 gm/m$^2$, 6 gm/m$^2$ and 8 gm/m$^2$. Curing is done with an excimer YAG (365 nm) laser. Each coupon is then plated with a copper film of 1.5 microns using Coppermerse® 80 electroless copper plating bath. Plating is done for 40 minutes at 38° C.

Surface resistivity of the copper films is measured for each of the twelve coupons using a Versatronic R-100 resistance meter with a 4-electrode probe system. An average surface resistivity of 4 mΩ/cm$^2$ is expected for the copper films.

Example 6

Catalyst of Hydrous Oxide of Palladium

A 1% wt. solution of palladium chloride is dissolved in 100 mL of water. The mixture is stirred until the palladium chloride is dissolved. A sufficient amount of sodium hydroxide is added to the solution to provide a pH of 3 to form a brown hydrous oxide dispersion. The dispersion is filtered and washed with deionized water.

0.1 gm of the hydrous oxide of palladium is mixed with 8 gm of barium sulfate having an average particle diameter of 500 nm, 1 gm 2-cyanoethyl-triphenyl phosphonium chloride, and 2 gm of a cationic dispersion of a polyurethane containing hydrophobic segments in its backbone using a sonic mixer. A sufficient amount of water is added to the dispersion to bring the volume to 500 mL. The dispersion is mixed to form a slurry. The primer is applied to an ABS polymer substrate, which is to be plated with a metal from an electroless metal bath. A photo-tool is applied to the coated ABS substrate. The primer is cured using an excimer lamp (172 nm). The unexposed portion of the primer is developed with ethyl alcohol. Copper is then electrolessly plated on the coated substrate using a conventional method and bath. The metal plating on the completed article may function as an EMI or RFI shield.

Example 7

Catalyst of Hydrous Oxide of Platinum

A 1% wt. solution of platinous dichloride is formed by dissolving the salt in 100 mL of dilute hydrochloric acid at 80° C. After cooling to room temperature, the pH of the solution is raised to 3 with sodium hydroxide to form a precipitate of hydrous oxide of platinum. The precipitate is filtered and washed with deionized water.

0.1 gm of the precipitate is then mixed with 5 gm of iron oxide with an average particle size of 50 nm, 5 gm of barium sulfate with an average particle size of 120 nm, 0.1 gm of benzophenone and 3 gm of an anionic dispersion of a polyurethane containing hydrophobic polyolefin segments in its backbone. The composition is mixed using a high shear mixing apparatus to form a slurry.

The catalyst primer is applied to a silicate substrate, which is to be plated with a metal from an electroless metal bath. A photo-tool is applied to the primer coated silicate substrate, and then is exposed to UV radiation using an excimer lamp (300 nm). The unexposed portions of the primer are developed with isopropyl alcohol. The silicate is electrolessly plated with copper. The metal film may function as an EMI or RFI shield.

Example 8

Catalyst of Hydrous Oxide of Copper

A 1% wt. solution of cupric chloride is formed by dissolving the cupric chloride in 100 mL of water. The solution is then heated to 70° C. and adjusted with sodium hydroxide to a pH of 6. A precipitate of hydrous oxide of copper is formed.

0.2 gm of the hydrous oxide of copper is mixed with 15 gm of analcite particles having an average size of 400 nm along with 2 gm of a bisphenol S-type epoxy resin, 0.1 gm of 2-chlorothioxanthone, and a sufficient amount of water to provide 1 liter. Mixing is done with a high shear stirring apparatus.

The slurry is applied as a catalyst primer to a polystyrene substrate. A photo-tool is applied to the coated polystyrene and then exposed to UV radiation at 275 nm using an excimer lamp. The unexposed primer is developed away with isopropyl alcohol. The polystyrene is then plated with copper. The metal films may function as EMI or RFI shields for various electronic articles.

Example 9

Catalyst of a Hydrous Oxide of Gold

A 1% wt. solution of auric chloride is dissolved in 100 mL of water. The pH of the solution is raised over a period of 2 days to 5 with a sufficient amount of sodium hydroxide. During raising of the pH the solution is continuously stirred and heated to 40° C. to form a brown hydrous oxide of gold precipitate. The precipitate is filtered and washed.

0.3 gm of the precipitate are mixed with 15 gm of silicate particles having an average diameter of 100 nm, 5 gm of barium sulfate particles having an average size of 10 nm, and 3 gm of a bisphenol F-type epoxy resin, 1 gm of diphenyl iodonium chloride and enough water to bring the volume to one liter. Mixing is down with a high shear stirring apparatus.

The catalyst primer applied to an ABS substrate, is cured using an excimer lamp (275 nm) then plated with gold using an electroless metal plating bath. The metal film may function as an EMI or RFI shield in an electronic article.

Example 10

UV Curable Catalyst of Hydrous Oxide of Silver

A stock solution of hydrated silver hydroxide was prepared by mixing 50 gm of silver nitrate ($AgNO_3$) with 10 gm of sodium hydroxide at 20° C., which formed a brown precipitate of hydrated silver oxide. The precipitate was allowed to settle and was then washed with a sufficient amount of deionized water to bring the pH to 9.

1 gm of hydrated silver oxide was then added to an aqueous composition containing 27 gm of barium sulfate ($BaSO_4$) with an average particle size of 300 nm and 1.5 gm of CG250 iodonium salt (obtainable from Ciba Geigy). The solids were dispersed in water under high-shear agitation using a stirring apparatus. 8.5 gm of bisphenol-A epoxy resin with an average molecular weight of 715 equivalent weights and 18 gm of butyl carbitol acetate (coalescing agent) was then added and mixed under low-shear using a stirring apparatus until a uniform slurry was formed.

The slurry was applied to an FR4/glass-epoxy substrate, allowed to air dry for 30 minutes and then baked at 65° C. for 30 minutes. A photomask having three different patterns was applied to the coated FR4 substrate and exposed to UV radiation at 325 nm for 1 minute. Isopropyl alcohol was then applied as a developer to remove the unexposed portion of the coating from the substrate.

The substrate was then placed into a commercial electroless copper plating system (Coppermerse® 80 from Rohm and Haas Electronic Materials, LLC). The electroless plating was done at 43° C. for 45 minutes to deposit 1.5 microns thick copper layers. The substrate was then removed from the plating system, rinsed with deionized water and dried at 20° C.

Figure 2:
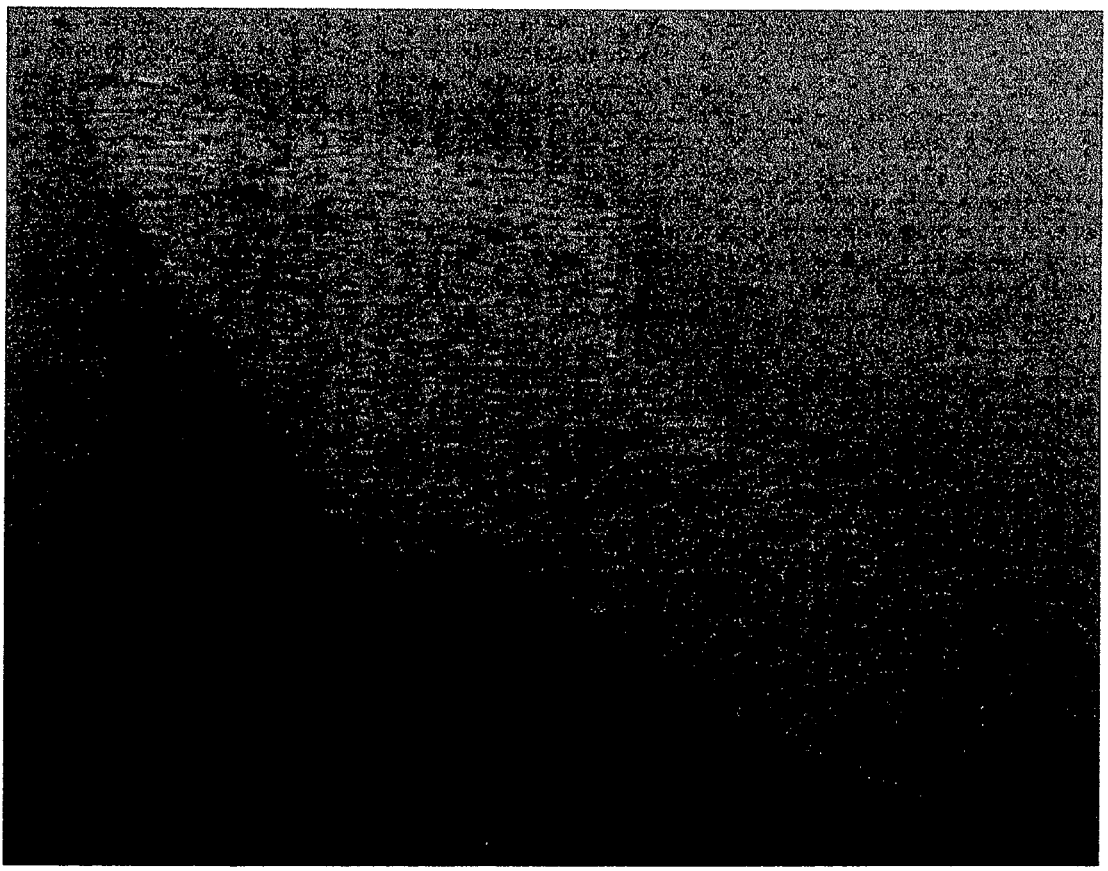
FIG. 2 is another SEM at 2000× of copper selectively deposited with a UV cured catalyst on an FR4 substrate.
Figure 3:
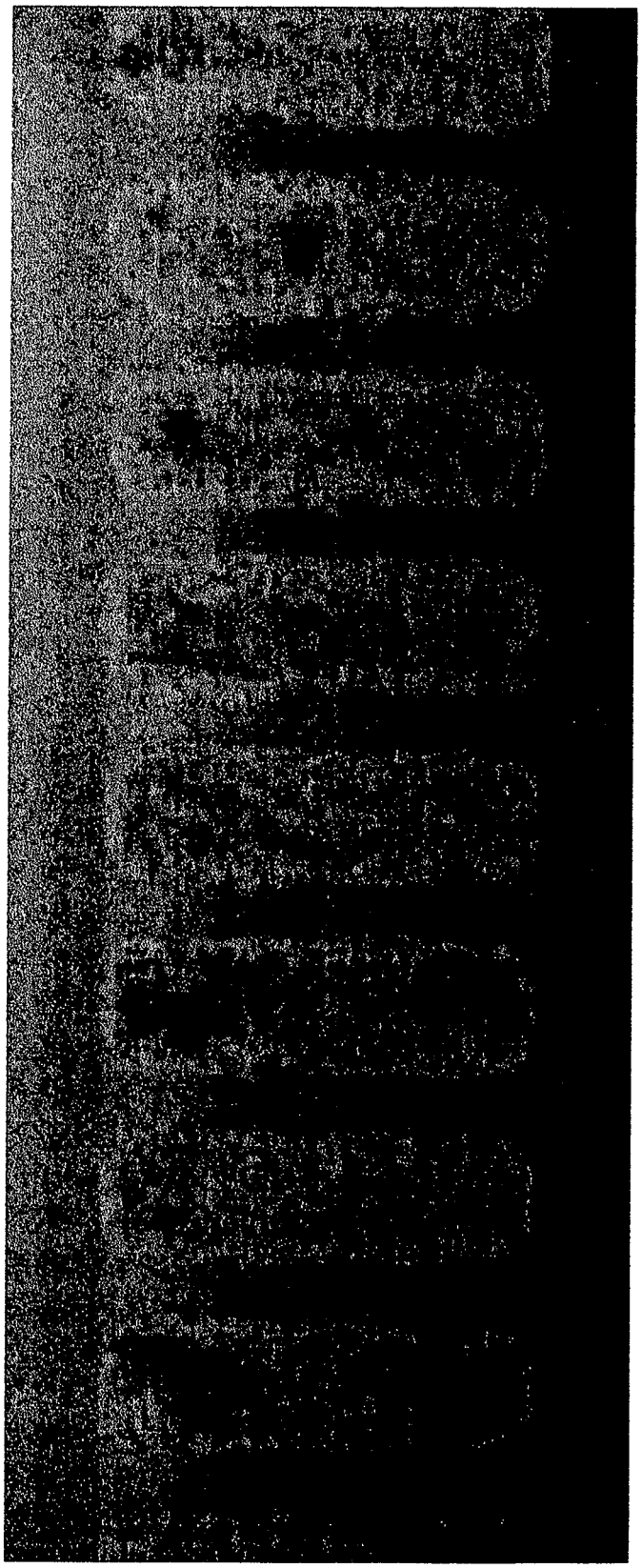
FIG. 3 is a SEM at 2000× of a plurality copper bars selectively deposited with a UV cured catalyst on an FR4 substrate.

FIGS. 1, 2 and 3 show the copper deposited on the FR4 substrate in the shape of a star, arrow and a series of copper bars, respectively. The edges formed by copper deposits were smooth and discrete. The surface resistance for the copper coatings were less than 10 m$\Omega$/cm$^2$.

An adhesion test was conducted according to ASTM 3359 in which a 2 mm-spaced cross-hatch pattern was scribed onto the copper patterns and Permacel® tape was adhered over the scribe marks and then pulled off to see if any of the scribed-coating de-adheres. No de-adhesion was observed.

What is claimed is:

1. A composition comprising a catalyst, the catalyst comprises a hydrous metal oxide or hydroxide of a catalytic metal, one or more carriers having average particle sizes from 5 nm to 900 nm, the one or more carriers are in amounts of 30 times or greater than the weight of the catalytic metal in the hydrous metal oxide or hydroxide, one or more UV curing agents, and one or more water-soluble or water-dispersible organic compounds.

2. The composition of claim 1, wherein the catalytic metal comprises silver, gold, platinum, palladium, indium, rubidium, ruthenium, rhodium, osmium, iridium, copper, cobalt, nickel, or iron.

3. The composition of claim 1, wherein the carrier particles comprise multi-valent cation and anion pairs, metal oxides, silicates, silica, or mixtures thereof.

4. The composition of claim 1, wherein the UV curing agent comprises onium salts, free radical generators, or mixtures thereof.

5. The composition of claim 1, wherein the water-soluble or water-dispersible organic compound comprises a polyurethane, epoxide, or mixtures thereof.

6. The composition of claim 1, wherein the water-soluble, or water-dispersible organic compound comprises acrylic homopolymers, acrylic copolymers, lactic acid homopolymers or copolymers, polyamides, polyesters, alkyd resins, ethylene copolymers, chlorinated homopolymers, copolymers of vinyl chloride, polymers of vinyl acetate, polymers of vinyl propionate, cyclisized rubber, chlorinated rubber, nitrocellulose, ethyl cellulose, ethylhydroxy cellulose, coumarine-indene resins, terpene resins, polyvinyl acetal resins, cellulose esters, shellac, poly alkylglycols, starch, carbohydrates, or mixtures thereof.

7. The composition of claim 1, wherein the one or more carriers are in amounts of 55 to 330 times the weight of the catalytic metal in the hydrous metal oxide or hydroxide.

8. The composition of claim 7, wherein the one or more carriers are in amounts of 60 to 300 times the weight of the catalytic metal in the hydrous metal oxide or hydroxide.

* * * * *